(12) United States Patent
Watkins, Jr.

(10) Patent No.: US 7,659,728 B1
(45) Date of Patent: Feb. 9, 2010

(54) METHOD AND APPARATUS FOR MEASURING DEGRADATION OF INSULATION OF ELECTRICAL POWER SYSTEM DEVICES

(76) Inventor: Kenneth S. Watkins, Jr., 372 River Dr., Dahlonega, GA (US) 30533

( * ) Notice: Subject to any disclaimer, the term of this patent is extended or adjusted under 35 U.S.C. 154(b) by 48 days.

(21) Appl. No.: 11/894,904

(22) Filed: Aug. 22, 2007

Related U.S. Application Data (60) Provisional application No. 60/839,606, filed on Aug. 23, 2006.

(51) Int. Cl.
*H01H 31/12* (2006.01)
*G01R 31/06* (2006.01)

(52) U.S. Cl. .................. 324/551; 324/546; 324/554
(58) Field of Classification Search ......... 324/545–547, 324/551–554, 772
See application file for complete search history.

(56) References Cited

U.S. PATENT DOCUMENTS

| | | | |
|---|---|---|---|
| 3,603,142 A | | 9/1971 | Saylak et al. |
| 4,675,662 A | | 6/1987 | Kondo et al. |
| 5,019,760 A | * | 5/1991 | Chu et al. .................. 324/772 |
| 6,051,980 A | * | 4/2000 | Divljakovic et al. ......... 324/551 |
| 6,323,658 B1 | * | 11/2001 | Kendig et al. ............... 324/551 |
| 6,483,319 B1 | * | 11/2002 | Kendig et al. ............... 324/551 |
| 2005/0268734 A1 | * | 12/2005 | Watkins, Jr. et al. ....... 324/71.1 |
| 2007/0166831 A1 | | 7/2007 | Watkins, Jr. et al. |

FOREIGN PATENT DOCUMENTS

| | | |
|---|---|---|
| JP | 361044339 A | 3/1986 |
| JP | 2000356660 | 12/2000 |
| WO | WO 03/076953 | 9/2003 |
| WO | WO 2005/081930 | 9/2003 |

OTHER PUBLICATIONS

"An Electrical Approach to Monitor Wire and Cable Thermal Oxidation Aging Condition Bas4ed on Carbon Black Filled Conductive Polymer Composite", YangYang Sun et al., Journal of Polymer Science Jul. 15, 2004.

* cited by examiner

*Primary Examiner*—Timothy J Dole
(74) *Attorney, Agent, or Firm*—Kenneth S. Watkins, Jr.

(57) ABSTRACT

A method for measuring degradation of electrical power system device insulation utilizes a conductive composite sensor. A selected polymeric matrix of the conductive composite provides a sensor resistance response that correlates to the mechanical degradation of the insulation. The sensor may be embedded in the windings, core or stator of the electrical power system device and wired to a connector on the electrical power system device for interrogation by an ohmmeter.

22 Claims, 10 Drawing Sheets

METHOD AND APPARATUS FOR MEASURING DEGRADATION OF INSULATION OF ELECTRICAL POWER SYSTEM DEVICES

CROSS REFERENCE TO RELATED APPLICATIONS

This application claims the benefits of U.S. Provisional Application No. 60/839,606 filed Aug. 23, 2006.

FIELD OF THE INVENTION

The present invention relates to methods and apparatus for determining the degradation of insulation systems for electrical power system devices such as motors, generators and transformers.

BACKGROUND OF THE INVENTION

The reliability of electrical power system devices such as electrical motors, generators and transformers is of critical importance in many industries and service providers. For example, failure of electrical motors in many process industries may result in costly plant shutdowns. Likewise, failure of motors in water supply system applications can lead to widespread loss of potable or fire protection water. Loss of generators or distribution transformers may lead to widespread power outages and unsafe conditions. Many operators of electrical power system devices are looking to predictive maintenance technologies to reduce costs and improve safety of operations.

Many technologies are available to detect possible problems with mechanical components in motors and generators, such as bearings. With enough warning, these components may be replaced or repaired during scheduled outages instead of during costly unplanned shutdowns.

However, many failures in electrical power system devices result from failure of the insulation system itself. For example, insulation varnish in a motor may degrade and become brittle with age. Under stress, the insulation itself may crack and fail, resulting in coil shorting and shutdown of the motor.

Currently, there are limited means to detect degradation of insulation systems in electrical power system devices. One of the most common methods to approach the problem is to assign an operational life based on manufacturer's recommendations or operator's experience. Upon completion of the expected life, the device is replaced or re-wound. This method is often inadequate since the local environmental conditions can have a substantial effect on the life of the insulation. For example, a 10 degree Celsius increase in temperature of the insulation system may decrease the lifetime of the insulation system by one-half. Load changes, or blocking of cooling air can have a substantial effect on device lifetime that scheduled replacement methods cannot predict.

Visual and tactile inspections are another method used in some commercial and industrial applications. Visual inspections are often difficult because much of the insulation system may not be visible and device disassembly is required. These inspections are time consuming, very subjective in nature and have poor capability for predicting remaining life.

Another common method to monitor insulation condition is to "megger" a motor by applying a high potential on a winding and measure leakage current. While this method is effective in finding existing problems resulting from insulation failure, it is of very limited effectiveness in forecasting future insulation failure. Installed systems are very costly and portable systems require shutting down the equipment and lifting leads in order to test.

Other methods for measuring insulation system condition and predicting remaining life include partial discharge and phase analysis technologies. The equipment required for these methods is very costly, in some cases is only effective on high voltage equipment. These methods are of limited effectiveness in predicting remaining life and require specialized training.

An improved method is needed to monitor the condition of electrical power system devices and to predict remaining life.

OBJECTS AND SUMMARY OF THE INVENTION

Therefore, an object of the present invention is to provide a method for measuring degradation of electrical power system device insulation that provides sufficient warning to allow replacement or repair before failure of the device.

Another object of the present invention is to provide a method for measuring degradation of electrical power system devices that utilizes an in-situ sensor having an electrical output corresponding to the current degraded state of the insulation system.

Another object of the present invention is to provide a method for measuring degradation of electrical power system devices that allows accurate prediction of remaining insulation system life.

Another object of the present invention is to provide a method for measuring degradation of electrical power system devices that automatically integrates the aging effects of the insulation without electrical power until interrogated.

Another object of the present invention is to provide a sensor for measuring degradation of electrical power system devices that is small and can be located in compact electrical power system devices such as fractional horsepower motors and actuators.

Another object of the present invention is to provide a sensor for measuring degradation of electrical power system devices that is made of the same polymer as the insulation system to provide accurate response to operational and environmental conditions.

The method of the present invention utilizes a degradation sensor having a polymeric portion that degrades similar to the insulation of the electrical power system device as a result of thermal and other environmental stressors. The polymeric portion of the sensor causes a change in an easily measured electrical property of the sensor that correlates to mechanical, electrical and/or chemical degradation of the insulation of the device.

For example, polymeric degradation mechanisms such as volatile fraction loss, chain scission and chain crosslinking that cause the insulation system to embrittle and eventually fail, also result in shrinkage of the polymer. Shrinkage can be used to produce a change in the electrical property of a sensor such as the resistance of a conductive composite sensor made of a polymer matrix and a conductive filler.

In one method of this disclosure, the degradation sensor utilizes a polymer chosen to produce an electrical resistance change that correlates to at least one of the insulation system portions of the electrical power system device. The correlation between sensor output and insulation condition is determined by comparing sensor response to the activation energy of degradation of the insulation portion under similar environmental stressor conditions.

For example, a common degradation reaction for varnish winding insulation in an electric motor is loss of tensile strength. This may be measured by standard industry methods such as a helical coil test which measures the remaining tensile strength after accelerated aging of the coils. When this test is done at several temperatures, and the times to failure plotted on an Arrhenius plot, the resulting curve allows prediction of failure at other temperatures. The slope of the curve is called the activation energy and defines the degradation response rate relative to a given temperature.

In the present method, a polymer is selected which, when made into a conductive composite, produces a sensor activation energy which is similar to the insulation degradation activation energy. The sensor activation energy is determined by an Arrhenius plot of the time to a selected electrical end point at several temperatures. In a preferred embodiment, the electrical end point corresponds to the time of mechanical end point of the insulation at the same temperature.

In the preferred embodiments, the sensor polymer is the same polymer as used in the insulation. This is advantageous because sensor degradation (and electrical response) will closely follow insulation degradation if the sensor is placed so that it sees the same environmental conditions as the insulation.

The degradation sensor can be a discrete sensor having leads embedded in the conductive composite, or it the sensor can be deposited on a portion of the device itself as a film or layer. Sensors may be embedded in a stator, core or other portion of the device, or they may be bonded or embedded in the windings of the device. Sensors may be wired to connectors for measurement, or they may be measured by contact electrodes on the body of the sensor. In still other embodiments, the sensors may be connected to wireless transponders such as radio frequency identification devices (RFIDs). Since the degradation sensor automatically integrates degradation effects without electrical power, the sensor is well adapted to passive RFIDs. An RFID reader provides power to the sensor when interrogated.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

The following is a description of the preferred embodiments of conductive composite degradation sensors, readers and methodology for detecting degradation of the insulation systems of power system devices such as motors, generators and transformers.

Prior work disclosing use of conductive composites to model aging of polymeric materials is disclosed in U.S. utility application Ser. No. 10/506,518, U.S. Utility application Ser. Nos. 11/510,875, 11/552,197 and PCT Applications PCT/US2005/005604 and PCT/US2006/006187, hereby incorporated by reference. These references show a general decrease in resistivity of a conductive composite made of a polymeric matrix and conductive particle filler as the composite degrades. This is due to various degradation mechanisms such as mass loss, chain cross linking, and chain scission of the polymer matrix, resulting in a higher volume fraction of conductive particles as the polymer degrades.

For the purposes of this disclosure, electrical power system devices includes heat-producing electrical and mechanical-electrical devices having at least one electrical winding, a frame and an insulation system providing electrical insulation between adjacent windings, and/or the windings and the frame. For the purposes of this disclosure sensor electrical property measurement includes electrical resistance, conductance, capacitance, inductance, reactance, breakdown voltage, and dielectric strength.

Figures 1A, 1B:
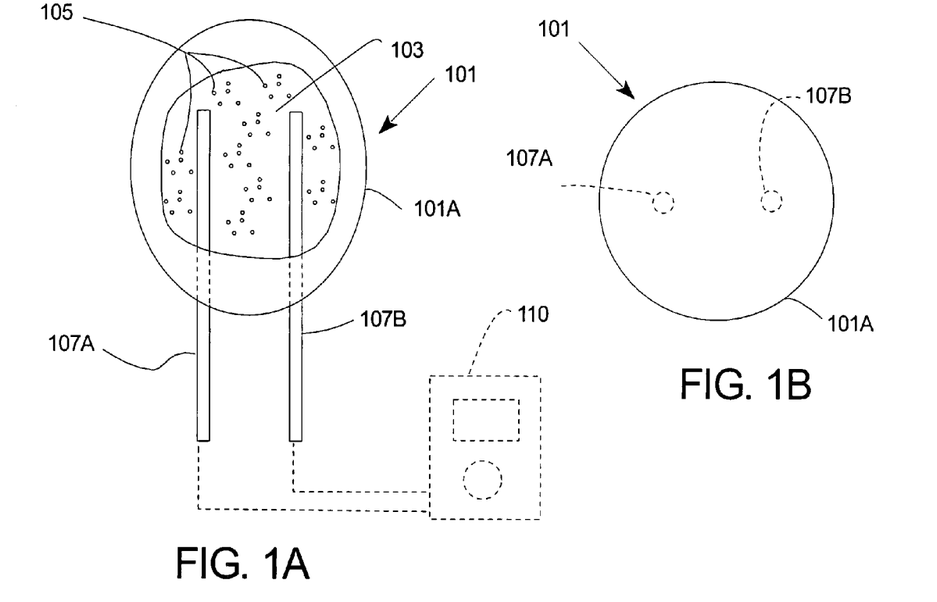
FIG. 1A is a partial cutaway drawing of a discrete degradation sensor for electrical power system devices showing connection to a reader.
FIG. 1B is a top view of the sensor of FIG. 1.

FIG. 1A is a partial cutaway drawing of a conductive composite degradation sensor 101 comprising a polymeric matrix 103, conductive filler particles 105, and electrodes or leads 107A, 107B. In the preferred embodiments, polymeric matrix 103 comprises at least one polymeric component of the insulation system of an electrical power system device as described in more detail in the following figures and descriptions. FIG. 1B is a top view of sensor 101. In the preferred embodiments, sensor 101 is a discrete sensor having a body 101A generally spherical in shape. In other embodiments, sensor body 101A may have other shapes such as solid rectangular, disc, or other shapes suited to manufacturing or application conditions. Leads 107A, 107B provide a means to electrically connect sensor 101 to an electrical property measuring device or reader 110. In a preferred embodiment, reader 110 is an ohmmeter providing measurement of the resistance of sensor 101.

Figures 2A, 2B, 2C:
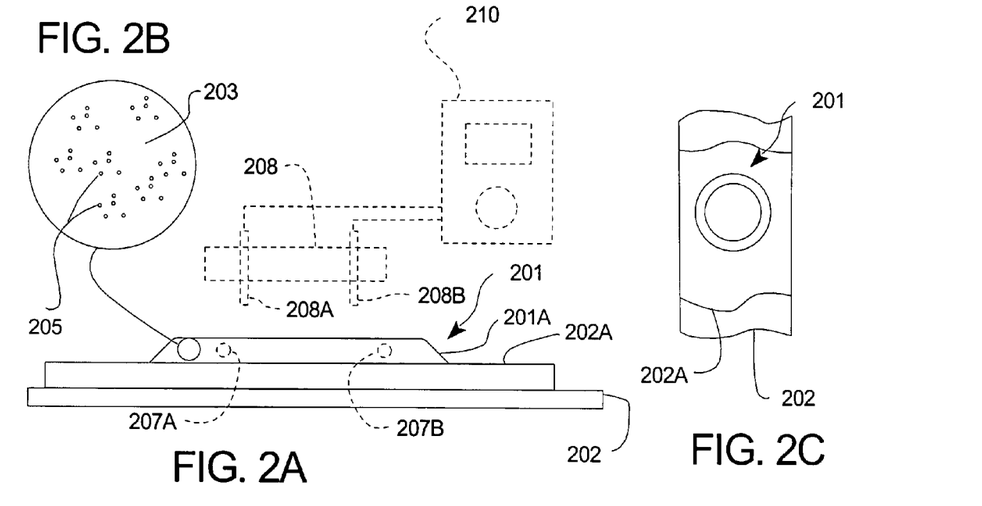
FIG. 2A is a side elevation view of a sensor deposited or bonded to an insulated portion of an electrical power system device, and use of contact electrodes connected to a reader to interrogate the sensor.
FIG. 2B is a detail drawing of the sensor of FIG. 2A showing the polymeric matrix and conductive filler particles of the conductive composite.
FIG. 2C is a top view of the sensor of FIG. 2A.

FIG. 2A is an alternative embodiment of a conductive composite sensor 201 for electrical power system devices deposited or formed directly on an insulation portion 202A of device conductive portion 202. Device portion 202 may be a bus bar, winding portion, or part of a rotor, stator, core or frame of the device. Insulation portion 202A may be bus bar or winding insulation such as a varnish insulation, or it may be sheet or fiber insulative material such as slot insulation in electrical motors or generators. Sensor 201 comprises a matrix 203 and a conductive filler 205 as best seen in FIG. 2C. In the preferred embodiments, matrix 203 comprises at least one polymeric component of the insulation system of the electrical power system device as described in more detail in the following figures and descriptions.

Contact electrodes 208A, 208B of probe tip 208 are connected to a reader such as ohmmeter 210 to provide measurement of the resistance of sensor 201. In an alternative embodiment, electrodes or leads 207A, 2207B embedded in the body 201A of sensor 201 provide a means to connect sensor 201 to a reader. FIG. 2B is a top view of sensor 201.

Figure 3:
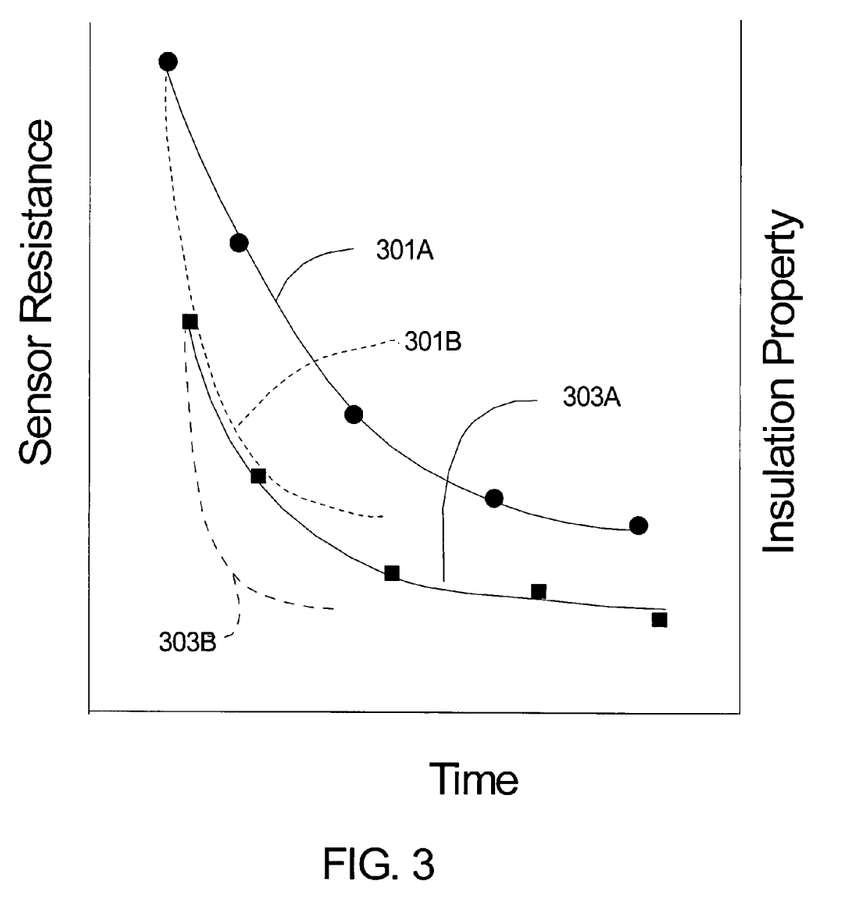
FIG. 3 is a plot of sensor degradation response and mechanical insulation property as a function of time under several specified environmental conditions.

FIG. 3 is degradation-time plot showing the electrical response (sensor resistance) vs. time for conductive composite sensors 101, 201 at a first specified environmental condition such as a first temperature as shown by curve 301A. The general decrease in sensor resistance is due to degradation mechanisms in the polymeric components of the matrix resulting in volumetric shrinkage of the matrix and as discussed further in the references cited in paragraph 2 of this section. Curve 301B shows sensor 101, 201 resistance vs. time for a second environmental condition such as a second temperature higher than the first temperature. The increased rate of degradation response is demonstrated by the increased steepness of the degradation curve 301B as compared to curve 301A.

Also shown in FIG. 3 is a plot showing an insulation property such as insulation tensile strength 303A vs. time taken at a first environmental condition such as the first environmental temperature of curve 301A. Curve 303B shows an insulation property such as tensile strength vs. time at a second environmental condition such the second temperature of curve 301B. Other insulation properties can also be plotted such as insulation mass, elongation-at-break, density or physical dimensions of insulation specimens such as length or volume. Still other procedures plot electrical breakdown properties as a function of time for a given temperature, such as the industry standard twisted pair test.

Figure 4:
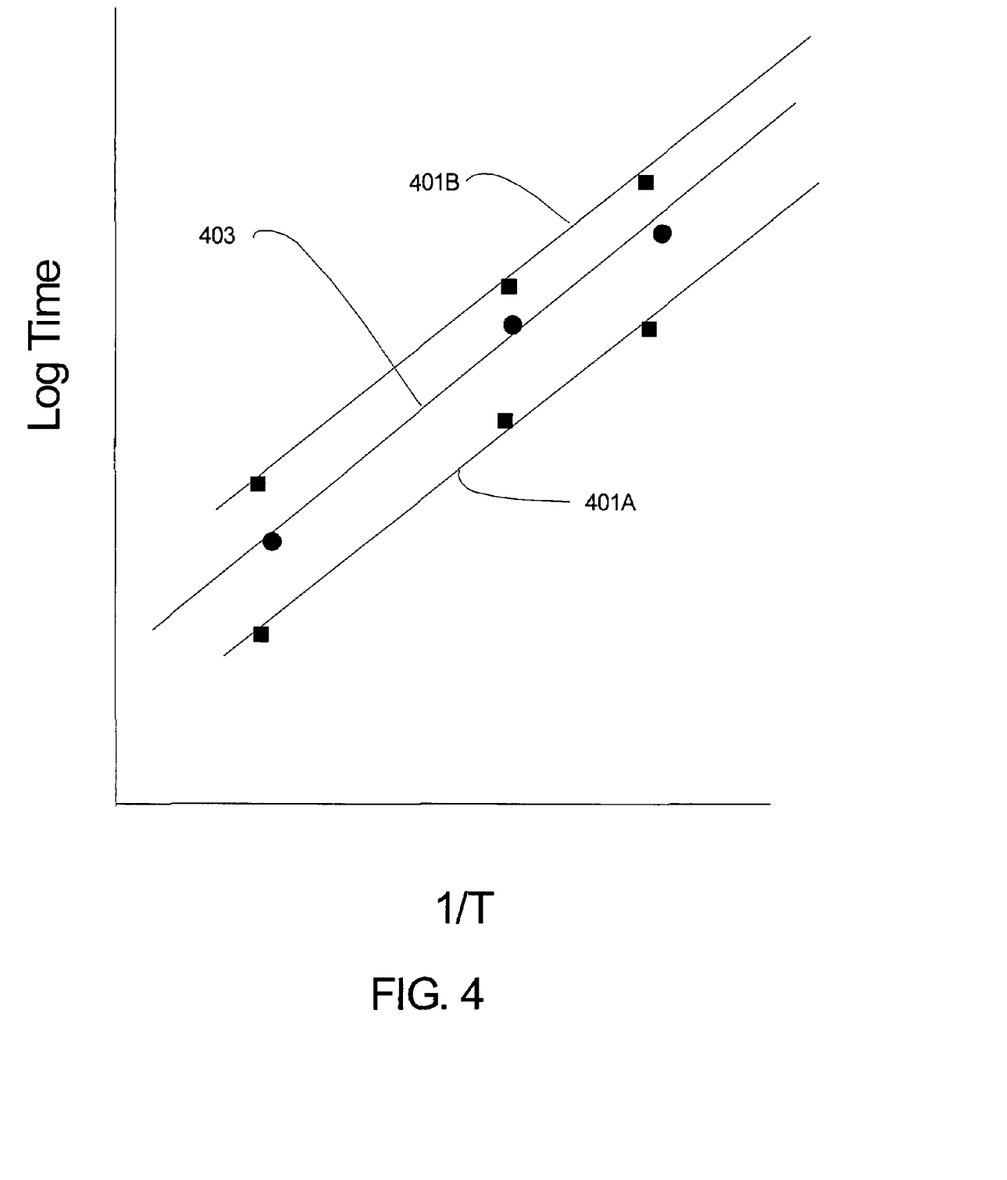
FIG. 4 is an Arrhenius plot showing insulation mechanical degradation and sensor electrical response having similar activation energies (slopes of the degradation curves)

FIG. 4 is an Arrhenius plot showing degradation curves for multiple temperatures. For example, curve 403 is a plot of the log of the time for a property of the insulation such as tensile strength to reach a specified degraded value at. the inverse of the absolute temperature (1/Ta) of the trial. The time to reach the specified degraded state is shown in at least two and preferably three or more temperatures to define curve 403. If the points of the curve define a generally straight line as shown in the figure, the time to the degraded state at any other temperature can be extrapolated as known in the art. For example, one method for determining the temperature rating of an insulation resin is to extrapolate the temperature at which curve 403 crosses a specified time such as 20,000 hours for a selected degradation strength of the insulation. The slope of curve 403 is the activation energy of the insulation degradation reaction.

By plotting the log of the time for the resistance of sensor 101, 201 to reach a selected drop in resistance at several temperatures results in curves such as 401A, 401B of FIG. 4. For example, curve 401A may result from selection of times for sensor resistance to drop one decade from the original value. Curve 401B may result from selection of time for sensor resistance to drop 3 decades from the original value.

In the present method, the polymeric component of sensor 101, 201 is chosen so that the slope of the sensor Arrhenius response curve, 401A, 401B has a slope (activation energy) which is similar to that of the insulation degradation curve 403. By comparing the time of insulation degradation to the selected end-point at a given temperature with that of sensor response at the same temperature, a sensor resistance drop is established which closely matches that of the insulation degradation.

In the preferred embodiments, the selected sensor polymer is one of the polymers used in the insulation system of the electrical power system device, and provides similar activation energies as the mechanical degradation activation energies such as tensile strength and shrinkage. In other embodiments, other polymers are selected which result in a similar sensor activation energy as the insulation degradation activation energy. In the preferred embodiments, the sensor activation energy as measured by sensor resistance drop is within 30% of the insulation degradation activation energy as determined by mechanical, electrical or chemical degradation tests. In the more preferred embodiments, the sensor activation energy as measured by sensor resistance drop is within 20% of the insulation degradation activation energy as determined by mechanical, electrical or chemical degradation tests. In the still more preferred embodiments, the sensor activation energy as measured by sensor resistance drop is within 10% of the insulation degradation activation energy as determined by mechanical, electrical or chemical degradation tests. In the most preferred embodiments, the sensor activation energy as measured by sensor resistance drop is within 5% of the insulation degradation activation energy as determined by mechanical, electrical or chemical degradation tests.

Figures 5, 5A, 5B:
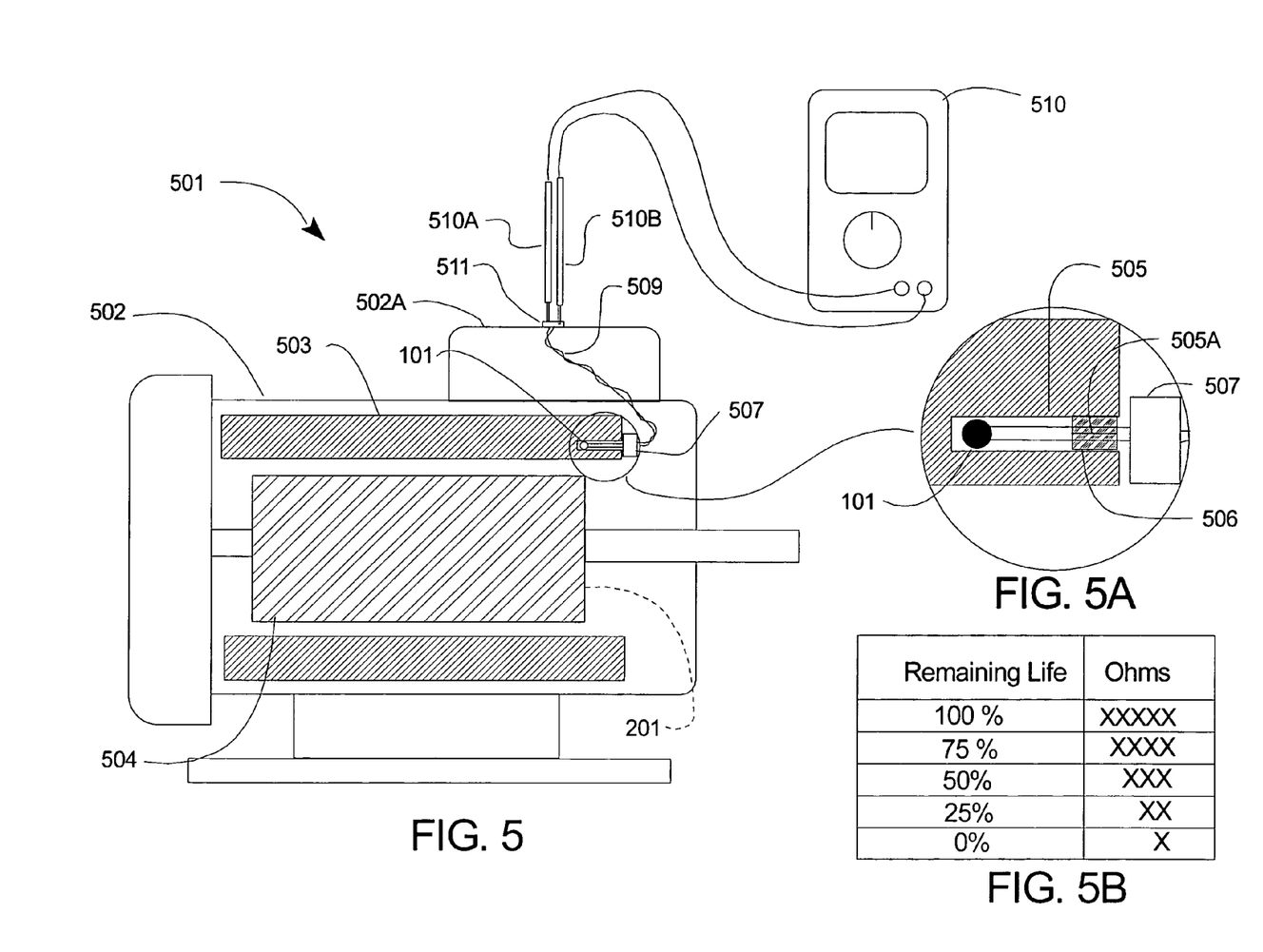
FIG. 5 is a side elevation cross section drawing of a motor or generator having a degradation sensor embedded in the stator and connected to a reader through a plug attached to the device.
FIG. 5A is a detailed cross section drawing of the degradation sensor embedded in a hole in the stator and attached to plug wiring.
FIG. 5B is a detail of a device nameplate displaying sensor values and the correlating remaining insulation life.

FIG. 5 is a cross section of sensor 101 installed in the stator 503 of motor 501. Motor 501 comprises frame 502, stator 503, and rotor 504. Sensor 101 is inserted in an aperture or hole 505 drilled in the end of stator 503, better shown in FIG. 5A. In the preferred embodiment, a means to exchange ambient air such as breathing hole 505A of insulative cap 506 provides two-way exchange of air between sensor 101 and outside air. In this manner, sensor 101 is subjected to environmental conditions such as temperature and humidity similar to that of the insulation varnish or other insulation components of motor 501. Female plug 507 and insulated conductors 509 connect sensor 101 electrically to reader plug 511 on terminal box 502A. In the preferred embodiments, reader plug 511 is a jack sized to accept the test probes of an ohmmeter such as ohmmeter 510. Sensor 101 is read by inserting test probes 510A, 510B in plug 511. FIG. 5B is a detail of a data plate attached to motor 501 listing remaining insulation life for given values of sensor 101 resistance.

Figure 5C:
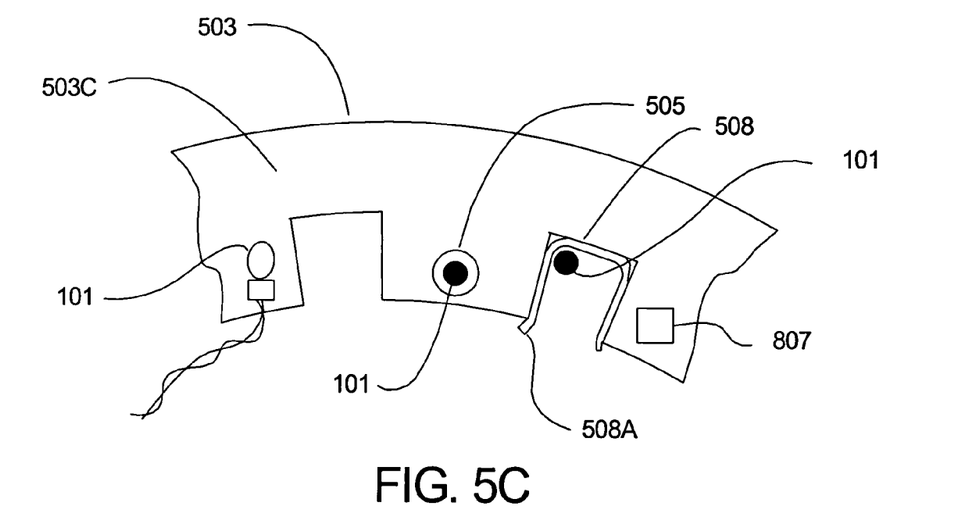
FIG. 5C is a detail side elevation drawing of the stator of the motor of FIG. 5 with windings removed for clarity showing alternative locations for the degradation sensor.
Figure 5D:
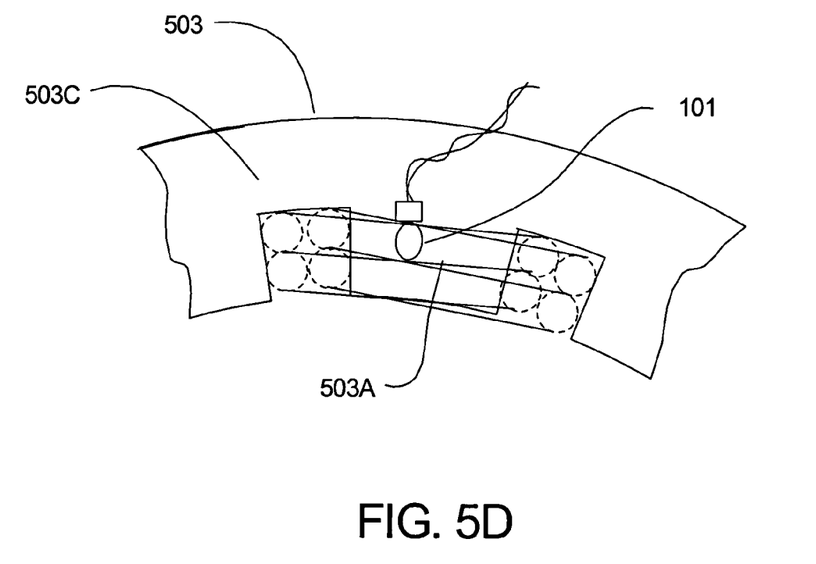
FIG. 5D is a detail side elevation drawing of an alternative sensor mounting method where the degradation sensor is bonded to a coil of the stator.

FIG. 5C is an end view of stator 503 showing sensor 101 in hole 505. Windings are omitted for simplicity. Alternate sensor 101 locations are shown on the outer face 503C of stator 503 and in slot insulation 508A of slot 508. FIG. 5D is an alternative embodiment showing sensor 101 bonded to stator winding 503A. Several possible locations for contact sensor 201 are shown in the figure, including stator face 503C and winding 503A. Sensors may be positioned at any location on motor 501, although in the preferred embodiments, the sensors are located so that they are exposed to temperatures at or near the maximum temperature of the motor. If sensor 101 is located at a position where the temperature is significantly less than the maximum temperature seen by the insulation subsystem it is monitoring, the sensor values corresponding to the remaining life of FIG. 5B are adjusted by use of degradation and Arrhenius curves of FIGS. 3 and 4 depending on the actual maximum temperature of the sensor location as compared to the maximum insulation temperature.

Figure 6:
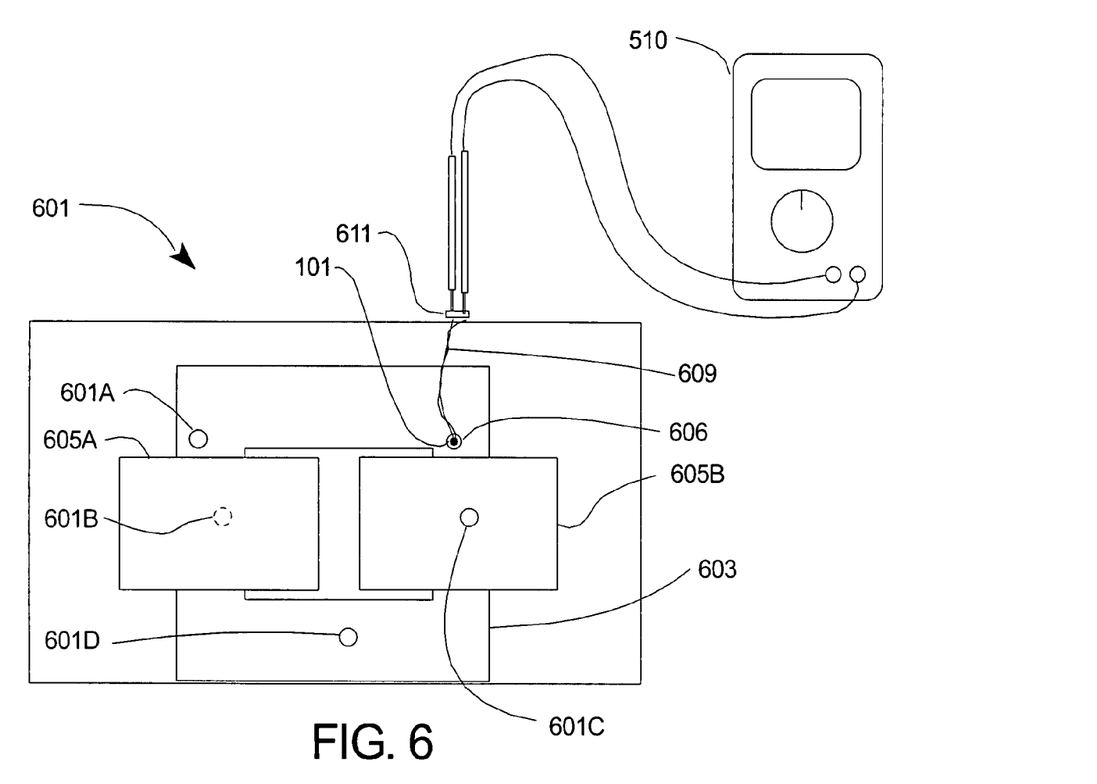
FIG. 6 is a schematic diagram of alternate locations of the degradation sensor disposed in a transformer.

FIG. 6 is a schematic diagram of sensors 101 and 201 installed in transformer 601. Sensor 101 may be installed in drilled apertures such as aperture 606 of core 603 and connected to reader plug 611 by insulated conductors 609. Sensor 101 is read by ohmmeter 510 similar to motor 501 of FIG. 5A. Alternative locations 601A, 601B, 601C, 601D for sensor 101 are shown in core 603 and windings 605A, 605B. Alternatively, sensor 201 may be installed in these or other locations and read by a contact reader 210 of FIG. 2A.

Figure 7:
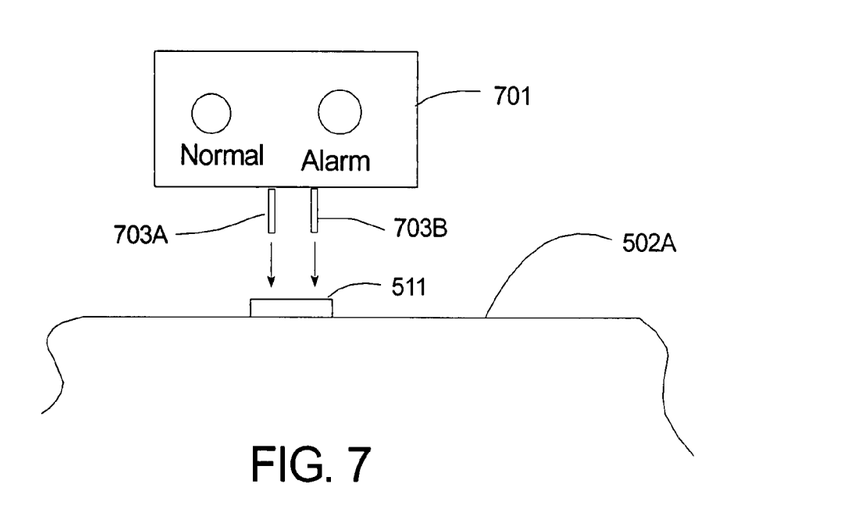
FIG. 7 is a connection diagram of a threshold reader/alarm device for insertion in the connector of an electrical power system device which provides warning of insulation system degradation.
Figure 7A:
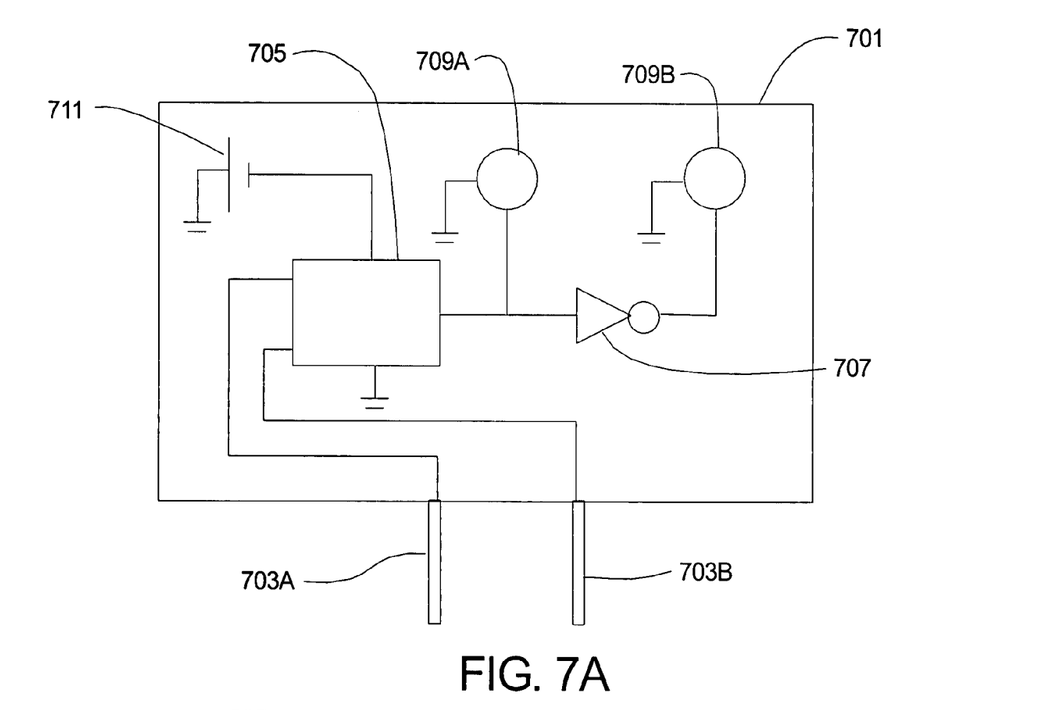
FIG. 7A is a schematic diagram of the threshold reader/alarm device of FIG. 7.

FIG. 7 is a connection diagram and FIG. 7A is a schematic diagram of an alarm device 701 for use with a sensor application in an electrical power system device such motor 501 of FIG. 5 or transformer 601 of FIG. 6. The applicable sensor is connected to device 701 via male plug terminals 703A, 703B inserted into the respective female plugs such as plug 511 of FIG. 5 and plug 611 of FIG. 6. A comparator circuit such as window comparator 705 compares the respective sensor resistance with reference elements (not shown) in comparator 705 and provides an output to alarm indicators 709A and 709B depending on the value of the measured sensor.

For example, if the sensor resistance is greater than a minimum threshold value (as determined by a first reference resistor in comparator 705 and less than a maximum threshold value (as determined by a second reference resistor in the window comparator 705), window comparator 705 produces a "normal" indication such as illumination of LED 709A. If sensor resistance is below the minimum threshold (for example if the sensor has degraded below the end-of-life resistance value, or sensor circuit wiring is shorted) or above the maximum threshold (such as an open in sensor wiring), the comparator circuit energizes alarm LED 709B via inverter gate 707.

When the LED 709B is energized, device 601 may be removed and an ohmmeter such as ohmmeter 510 of FIG. 5 may be inserted in the appropriate jack to further investigate the cause of the alarm. Battery 711 provides power to the alarm device.

Figure 8:
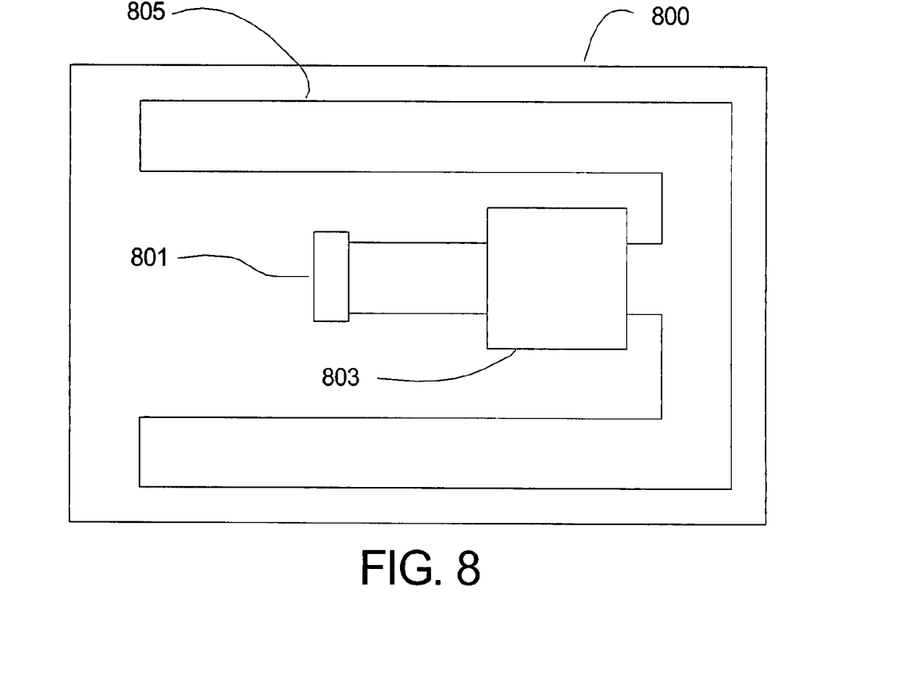
FIG. 8 is a schematic diagram of an RFID assembly for wireless communication of degradation sensor data.

FIG. 8 is a schematic diagram of a wireless transponder such as RFID assembly 800 to for communicating degradation data with a reader. Sensor 801 comprises a polymeric component, such as a conductive composite as previously described. Sensor 801 is attached to RFID chip 803 that communicates with a reader (not shown) via antenna 805. RFID assembly 800 may be bonded or otherwise attached in the vicinity of insulated portions of the electrical power system device such as location 807 of FIG. 5C.

Sensors 101, 201 may be made by mixing the selected polymeric resin and a conductive filler such as carbon black to provide a desired beginning sensor resistance. In the preferred embodiments, the beginning sensor resistance is selected between the percolation thresholds of the references of paragraph 2 of this section. The preferred beginning sensor resistance is high enough to provide good degradation sensitivity and low enough to be stable and easily measured by normal resistance measuring equipment. In the preferred embodiments, beginning sensor resistance is selected between 1,000 ohms and 100,000,000 ohms. In the more preferred embodiments, the beginning sensor resistance is selected between 10,000 and 10,000,000 ohms. In the still more preferred embodiments, the beginning sensor resistance is selected to be between 100,000 ohms and 1,000,000 ohms. The end-of-life resistance will depend on the insulation rating of the device, the degradation performance of the actual insulation components, the location of the sensor in relation to the peak temperatures experienced by the insulation, and the desired safety factors taken into consideration.

Figure 9A:
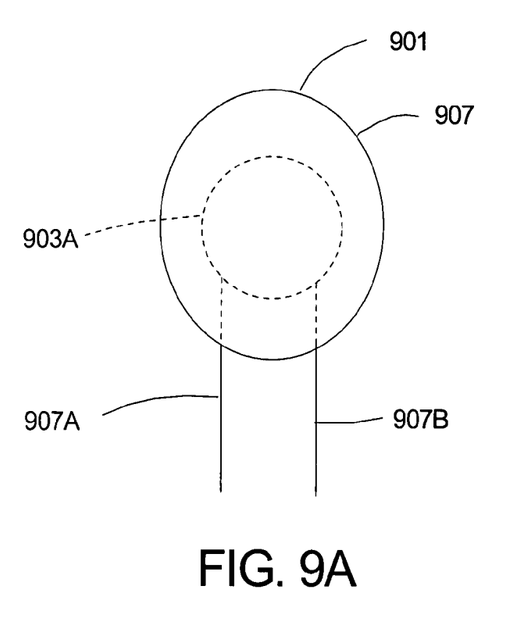
FIG. 9A is a front elevation drawing of an alternative degradation sensor utilizing a polymeric sensor portion to change the capacitance of the sensor as the polymeric portion degrades.
Figure 9B:
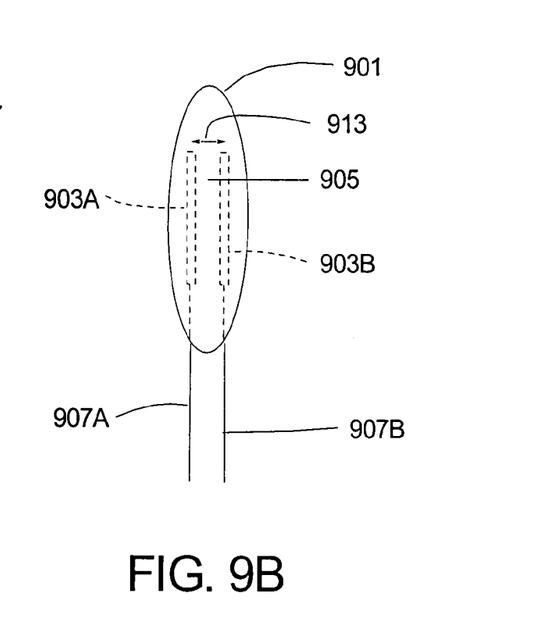
FIG. 9B is a side elevation drawing of the sensor of FIG. 9A.
Figure 10A:
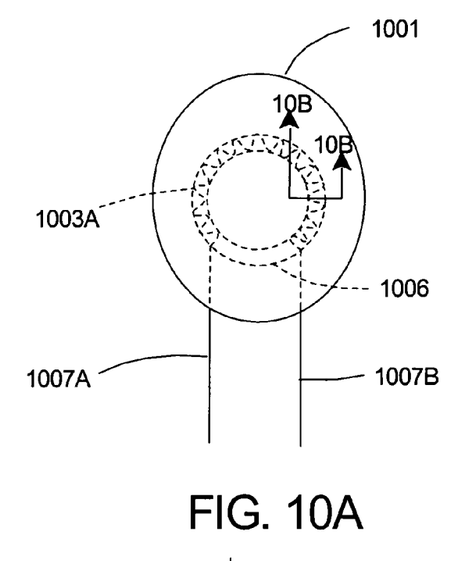
FIG. 10A is a front elevation drawing of an alternative degradation sensor utilizing a polymeric portion to change the inductance of the sensor as the polymeric portion degrades.

Degradation characteristics such as shrinkage of polymers allow use of other sensor electrical measurements in addition to resistance of a conductive composite sensor having a matrix of the selected polymer. For example, degradation-related shrinkage of polymeric components of sensor 901 of FIGS. 9 and 1001 of FIG. 10 provide alternative electrical property measurements that provide correlation to insulation system degradation.

Sensor 901 comprises two electrodes or plates 903A, 903B separated by a polymeric dielectric 905 between electrodes 903A, 903B. Dielectric 905 may also form body portion 907, or body portion 907 may be made of another material. Leads 907A, 907B provide a means to connect sensor 901 to a capacitance meter (not shown).

Figure 9C:
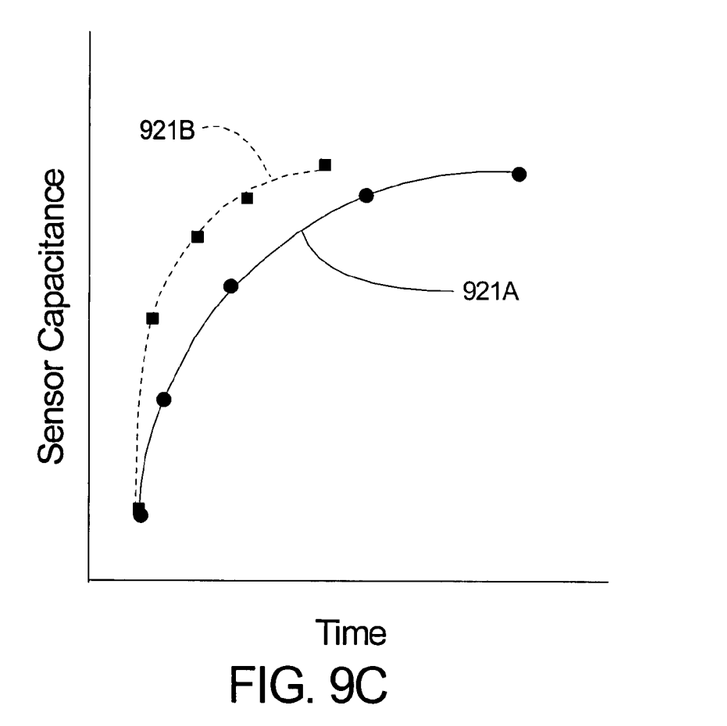
FIG. 9C is a degradation plot of the sensor of FIGS. 9A and 9B showing curves for capacitance as a function of time at two temperatures.

As polymeric dielectric 905 degrades, electrode spacing 913 decreases, increasing the capacitance as measured across leads 907A, 907B. FIG. 9C is a capacitance-time plot showing the capacitance of sensor 901 as a function of aging or degradation time. Curve 921A shows the increase in capacitance at one environmental condition such as a first temperature vs. time, and curve 921B shows the increase in capacitance at a second environmental condition such as a second temperature higher than the first temperature.

In a manner similar to that of conductive composite sensors, measurement of the capacitance of a sensor such as sensor 901 of FIG. 9 may be used to provide correlation with the mechanical, electrical or chemical degradation of the insulation system. A polymer forming the dielectric of the capacitor is chosen to provide a change in capacitance in time defining an activation energy similar to mechanical, electrical or chemical degradation activation energy as previously discussed. As the selected polymeric dielectric degrades, for example under thermo-oxidative environment, it shrinks, decreasing electrode separation and increasing capacitance of the sensor. By correlating capacitance change vs. time under several degradation environments with degradation of the insulation measured under the same environments, capacitance endpoints, and therefore degradation times for the sensor can be plotted on an Arrhenius plot to determine activation energy of the sensor response.

Figure 10B:
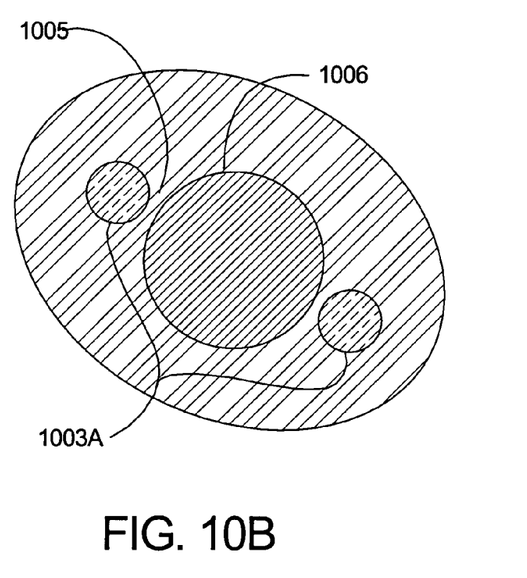
FIG. 10B is a cross section of the inductive element taken through lines 10B-10B of FIG. 10A.

FIG. 10A is a front elevation drawing of an inductive degradation sensor 1001 which comprises a winding 1003A separated from an inductive core 1006 by a polymeric insulative layer 1005. As the insulative layer 1005 shrinks due to the aging effects discussed earlier, inductive coupling increases and inductance an measured at leads 1007A, 1007B increases. FIG. 10B is a cross section drawing of the inductive core and winding of sensor 1001 taken along lines 10B-10B of FIG. 10A.

Figure 10C:
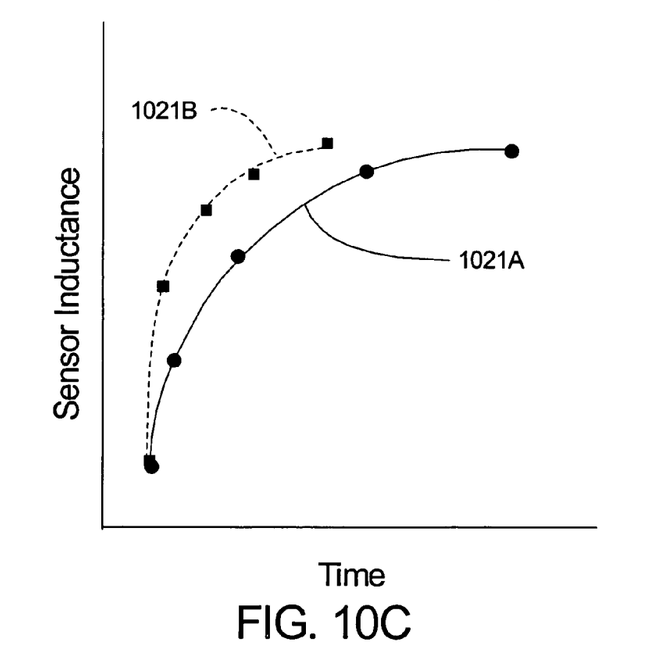
FIG. 10C is a degradation plot of the sensor of FIGS. 10A and 10B showing curves for inductance as a function of time at two temperatures.

FIG. 10C is inductance-time plot showing the inductance of sensor 1001 as a function of aging or degradation time. Curve 1021A shows the increase in inductance at one environmental condition such as a first temperature vs. time, and curve 1021B shows the increase in inductance at a second environmental condition such as a second temperature higher than the first temperature. Sensor polymer selection and output correlation with insulation degradation procedures are similar to those discussed for conductive composite and capacitance sensors.

The methodology and sensors of this invention utilize selection of a polymeric component of a sensor for which the slope of the sensor degradation curve, as measured by the electrical property measurement such as resistance drop or capacitance increase, has approximately the same slope (activation energy) as that of the mechanical, electrical or chemical degradation of the selected insulation resin for which the sensor is to monitor. If the activation energy for a curve defined by a selected resistance drop has approximately the same slope as the curve defined by the insulation property drop, the resistance drop to correlate to any property-degraded state of the insulation can be selected. In this way, sensor resistance will correlate to the degraded condition (measured mechanically, electrically, or chemically) for any environmental history.

Figure 11:
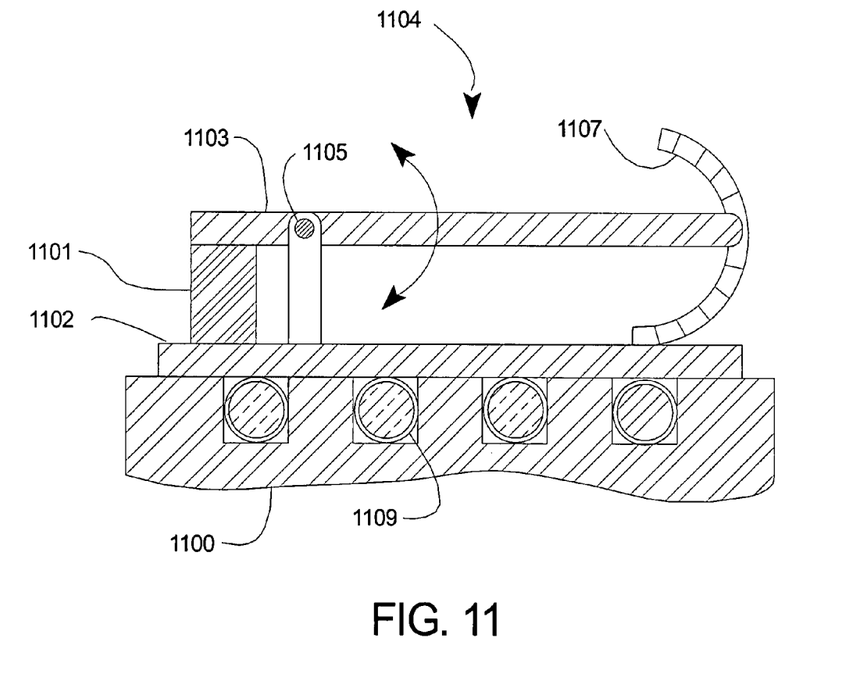
FIG. 11 is a cross section drawing of a mechanical indicator attached to a polymeric sensor for measuring the degradation of the insulation of an electrical power system device.

FIG. 11 shows yet another embodiment of a degradation sensor 1101 utilizing a mechanical indicator 1104 to amplify and transmit the small shrinkage of sensor 1101 as the sensor ages in an electrical power system device 1100.

Sensor 1101 comprises a polymer selected to provide shrinkage correlating to mechanical degradation of the insulation such as conductor insulation 1109 and as described previously. In the preferred embodiments, sensor 1101 comprises the same polymeric components as insulation 1109. Movement of pivot arm 1103, bonded to sensor 1101 is amplified by lever action and pivot 1105 and indicated on mechanical indicator scale 1107. Base plate 1102 provides mechanical support for the components of mechanical indicator 1104 and heat transfer from device 1100 to sensor 1101. Alternative embodiments of the sensor and indicator provide an electrical switch attached to sensor 1101 or mechanical linkage to provide an alarm or other indicator functions.

Mechanical measurements of the polymeric sensors may also be used to model insulation system degradation. For example, shrinkage measurements of sensor 1101 may be correlated to insulation system degradation.

In the preferred embodiments, the polymer components of the sensors are selected to so that the sensor response can be correlated with degradation of at least one insulation component of the insulation system. In the preferred embodiments, this is accomplished by selection of a polymeric component of the sensor which results in an activation energy by electrical measurement (as measured by sensor resistance drop, capacitance or inductance increase over a selected environmental exposure and taken at two or more temperatures or other environmental conditions) that is approximately the same as the activation energy of the insulation system component found from mechanical, electrical or chemical degradation measurements.

In the preferred embodiments, the selected insulation system component is the insulation winding varnish and the activation energy is that obtained from strength measurements such as the helical coil method for insulation varnish. In other embodiments, the activation energy is that obtained for electrical breakdown measurements such as the twisted pair method for varnish insulation. In still other embodiments, the insulation system activation energy is a mechanical, electrical or chemical degradation measurements for fiber or sheet insulation such as winding slot insulation. In still other embodiments, the insulation system activation energy result from mechanical, electrical or chemical degradation measurements for the enamel insulation of the magnet wire.

In the preferred embodiments, the sensor matrix (conductive composite sensors such as sensors 101, 201), dielectric (capacitive sensors such as sensor 901) or insulative layer (inductive sensors such as sensor 1001) is the same polymer as at least one of the insulation components of the insulation system. In the most preferred embodiments, the polymeric component of the sensor comprises the varnish resin of the insulation system. In the preferred embodiments of conductive composite sensors, the conductive filler is carbon black. In other embodiments, the conductive filler is metallic particles, metal oxide particles, or carbon nanotubes. In the preferred embodiments, sensor electrodes and leads are made of metals having minimal degradation reactions with air, sensor components, or other environmental components at temperatures at or above the maximum operating temperatures of the electrical power system device. Preferred materials are gold, silver and nickel.

Discrete sensors such as sensors 101 of FIG. 1A may be made by dipping, molding, casting or extrusion methods. Deposited sensors such as sensors 201 of FIG. 2A may be made by depositing composite sensor material on the desired component directly. Deposition may be made by painting, hot-melt, cold-melt, or other deposition methods known in the art. Alternatively, sensors 201 may be fabricated as discrete sensors such as sensor discs and bonded to the desired location. Discrete sensors 101 may be bonded, welded, or mechanically attached to the desired location in the electrical power system device.

Alternatively, components of the electrical power system device itself, such as metallic cores or frames may form one or more electrodes of an integral component sensor and an insulation component may form the polymeric component of an integral sensor. For example, a sensor such as sensor 201 of FIG. 2A may be deposited on a frame portion of a motor or core of a transformer and utilized as one of the "electrodes" of the sensor. Or, measurements of changes in inductance of a winding in an electrical power system device or the capacitance between windings of the device may be used to sense degradation of the insulation system.

Additional components may be added to the sensor to adjust the response in a desired manner. For example, antioxidants or catalysts may be added to adjust the sensor response to more closely match insulation degradation due to differences in environmental conditions.

Although the description above contains many specifications, these should not be construed as limiting the scope of the invention but merely providing illustrations of some of the presently preferred embodiments of this invention. Thus the scope of the invention should be determined by the appended claims and their legal equivalents, rather than by the examples given.

I claim:

1. A method of measuring degradation of an insulation of an electrical power system device, the method comprising the steps:

taking a first electrical measurement of an insulation degradation sensor disposed in the vicinity of an electrical winding of said power system device, said insulation degradation sensor comprising a polymer matrix and a conductive filler, said polymer matrix selected to provide a sensor activation energy derived from electrical property measurements of a degradation test sensor comprising said polymer matrix and said conductive filler and subject to an environmental stress, said sensor activation energy being approximately the same as an insulation activation energy derived from degradation measurements of said insulation subject to said environmental stress; and comparing said first electrical measurement of said insulation degradation sensor to a predetermined value corresponding to a degraded state of said insulation.

2. The method of measuring degradation of an insulation of claim 1 wherein said first electrical measurement is an electrical resistance measurement and said degradation measurements are mechanical degradation measurements.

3. The method of measuring degradation of an insulation of claim 1 wherein said first electrical measurement is an electrical resistance measurement and said degradation measurements are electrical breakdown measurements.

4. The method of measuring degradation of an insulation of claim 1 wherein said polymer matrix of said insulation degradation sensor comprises a polymeric component of said insulation.

5. The method of measuring degradation of an insulation of claim 4 wherein said insulation is an insulating varnish.

6. The method of measuring degradation of an insulation of claim 4 wherein said insulation is sheet insulation.

7. The method of measuring degradation of an insulation of claim 4 wherein said insulation is magnet wire insulation.

8. The method of claim 1 wherein said electrical power system device is an electric motor.

9. The method of claim 1 wherein said electrical power system device is an electric generator.

10. The method of claim 1 wherein said electrical power system device is a transformer.

11. The method of claim 1 wherein said insulation degradation sensor is disposed in a stator of said device.

12. The method of claim 1 wherein said insulation degradation sensor is bonded to a winding of said device.

13. The method of claim 11 wherein said insulation degradation sensor is disposed in an aperture of said stator.

14. The method of claim 1 wherein said insulation degradation sensor comprises an electrical lead wired to a connector disposed on said electrical power system device.

15. The method of claim 1 wherein said first electrical measurement is a resistance measurement made with a resistance measuring instrument.

16. The method of claim 15 wherein said resistance measuring instrument comprises a threshold circuit for providing an alarm when a predetermined degradation of said insulation is achieved.

17. The method of claim 15 wherein said step of comparing said first electrical measurement of said insulation degradation sensor to a predetermined value corresponding to a degraded state of said insulation is performed by use of a table of resistance values and corresponding degradation values.

18. A combination electrical power system device and insulation monitoring sensor comprising:

an electrical winding portion comprising a winding and winding insulation;

a conductive composite insulation degradation sensor disposed in said power system device in the vicinity of said electrical winding portion, said insulation degradation sensor comprising a polymeric matrix and a conductive filler, said insulation degradation sensor comprising an electrical activation energy determined by electrical property measurements of a test sensor made of said polymeric matrix and said conductive filler under an environmental stress, said electrical activation energy being approximately the same as an insulation activation energy determined by degradation property measurements of said insulation under said environmental stress; and a means for taking an electrical measurement of said insulation degradation sensor and comparing said electrical measurement to a predetermined value corresponding to a degraded state of said insulation.

19. The electrical power system device of claim 18 wherein said degradation property measurements of said insulation comprises mechanical property measurements.

20. The electrical power system device of claim 19 wherein said degradation property measurements of said insulation comprises tensile strength measurements.

21. The electrical power system device of claim 18 wherein said degradation property measurements of said insulation comprises electrical breakdown measurements.

22. The electrical power system device of claim 18 wherein said means for an electrical measurement of said insulation degradation sensor comprises at least one lead wire connecting an electrode of said insulation degradation sensor to an electrical connector disposed on said electrical power system device.

* * * * *